United States Patent
Matsumoto

(10) Patent No.: US 6,865,202 B2
(45) Date of Patent: Mar. 8, 2005

(54) SEMICONDUCTOR LASER ELEMENT

(75) Inventor: Mitsuhiro Matsumoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 412 days.

(21) Appl. No.: 10/171,513

(22) Filed: Jun. 14, 2002

(65) Prior Publication Data

US 2003/0016712 A1 Jan. 23, 2003

(30) Foreign Application Priority Data

Jun. 15, 2001 (JP) .................................. 2001-181660

(51) Int. Cl.⁷ .............................................. H01S 5/00
(52) U.S. Cl. ........................................ 372/45; 372/46
(58) Field of Search ................................... 372/45–46

(56) References Cited

U.S. PATENT DOCUMENTS

| | | | | |
|---|---|---|---|---|
| 5,177,757 A | * | 1/1993 | Tsugami ...................... | 372/45 |
| 5,956,361 A | * | 9/1999 | Ikeda et al. ................ | 372/46 |
| 6,072,817 A | * | 6/2000 | Adachi et al. .............. | 372/45 |
| 6,081,541 A | * | 6/2000 | Adachi et al. .............. | 372/45 |
| 6,140,142 A | | 10/2000 | Ikeda et al. | |
| 6,141,364 A | * | 10/2000 | Adachi et al. .............. | 372/45 |

FOREIGN PATENT DOCUMENTS

| | | |
|---|---|---|
| JP | 4-150087 | 5/1992 |
| JP | 4-309278 | 10/1992 |
| JP | 9-199790 | 7/1997 |
| JP | 9-298335 | 11/1997 |
| JP | 9-321385 | 12/1997 |
| JP | 10-154847 | 6/1998 |
| JP | 10-209553 | 8/1998 |
| JP | 2000-58982 | 2/2000 |

OTHER PUBLICATIONS

Chinese Office Action dated Jun. 11, 2004, with English translation.
Korean Office Action dated Jul. 28, 2004.

* cited by examiner

*Primary Examiner*—Minsun Oh Harvey
*Assistant Examiner*—Phillip Nguyen
(74) *Attorney, Agent, or Firm*—Morrison & Foerster LLP

(57) ABSTRACT

There is provided a semiconductor laser element, which has a small capacitance outside a ridge portion and high response speed and is able to effect pulse oscillation with a satisfactory pulse waveform. On a GaAs substrate 101, there are provided an n-type buffer layer 102, an n-type first clad layer 103, an MQW active layer 104, a p-type second clad layer 105, a p-type etching stop layer 106 that has an energy bandgap smaller than that of this second clad layer 105, a p-type third clad layer 107 that constitutes a ridge portion and a p-type protective layer 108. On both sides in the widthwise direction of the ridge portion are laminated a p-type spacer layer 109, an n-type current light confining layer 110, an n-type current confining layer 111 and a p-type flattening layer 112. On these layers is laminated a p-type contact layer 113. A depletion layer spreads into the spacer layer 109 when a bias voltage is applied. Therefore, a capacitance between the spacer layer 109 and the current light confining layer 110 is reduced, and a response speed during the pulse oscillation of the semiconductor laser element becomes fast.

15 Claims, 15 Drawing Sheets

OUTPUT WAVEFORM DURING PULSE OSCILLATION OF
SEMICONDUCTOR LASER ELEMENT OF INVENTION

OUTPUT WAVEFORM DURING PULSE OSCILLATION OF
SEMICONDUCTOR LASER ELEMENT OF PRIOR ART

ENERGY BAND DIAGRAM OF SEMICONDUCTOR LASER
ELEMENT WHEN BIAS VOLTAGE IS ZERO

ENERGY BAND DIAGRAM OF SEMICONDUCTOR LASER
ELEMENT WHEN BIAS VOLTAGE IS APPLIED

ENERGY BAND DIAGRAM OF SEMICONDUCTOR LASER ELEMENT
OF PRIOR ART WHEN BIAS VOLTAGE IS ZERO

ENERGY BAND DIAGRAM OF SEMICONDUCTOR LASER ELEMENT
OF PRIOR ART WHEN BIAS VOLTAGE IS APPLIED

SEMICONDUCTOR LASER ELEMENT

BACKGROUND OF THE INVENTION

The present invention relates to a semiconductor laser element.

Conventionally, there has been a semiconductor laser element as shown in FIG. 10 (refer to Japanese Patent Laid-Open Publication No. HEI 9-199790). This semiconductor laser element is a semiconductor laser element of an effective refractive index waveguide type. On an n-type GaAs substrate 501, there are provided an n-type GaAs buffer layer 502, an n-type AlGaAs first clad layer 503, a quantum well active layer 504, a p-type AlGaAs second clad layer 505, a p-type GaAs etching stop layer 506, a p-type AlGaAs third clad layer 507 and a p-type GaAs cap layer 508. The p-type AlGaAs third clad layer 507 and the p-type GaAs cap layer 508 are formed in a ridge-like shape to constitute a ridge portion 513. An n-type AlGaAs current light confining layer 509, an n-type GaAs current confining layer 510 and a p-type GaAs flattening layer 511 are laminated on both sides in the widthwise direction of this ridge portion 513 and on the etching stop layer 506. A p-type GaAs contact layer 512 is formed on the cap layer 508, end surfaces of the current light confining layer 509 and the current confining layer 510 and the flattening layer 511. A p-type electrode 514 is arranged on the p-type contact layer, and an n-type electrode 515 is arranged on the lower surface of the n-type GaAs substrate. This semiconductor laser element is mounted on a package and employed as a light source for an optical disk device.

The above-mentioned semiconductor laser element is fabricated as follows. That is, as shown in FIG. 11A, the n-type GaAs buffer layer 502, the n-type first clad layer 503, the non-doped Multiple Quantum Well (MQW) active layer 504, the p-type second clad layer 505, the p-type GaAs etching stop layer 506, the p-type third clad layer 507 and the p-type GaAs cap layer 508 are successively epitaxially grown on the n-type GaAs substrate 501 by a first-time metal-organic chemical vapor deposition method (hereinafter referred to as a MOCVD method).

Next, a stripe-shaped resist mask directed in the [011] direction is formed on the cap layer 508. Part of the cap layer 508 and part of the third clad layer 507 are etched to the etching stop layer 506, forming a ridge portion 513, which has a width of 2.5 μm and extends in the [011] direction (FIG. 11B).

After the resist mask on the cap layer 508 is removed, the n-type AlGaAs current light confining layer 509, the n-type GaAs current confining layer 510 and the p-type GaAs flattening layer 511 are successively laminated on the ridge portion 513 and the etching stop layer 506 by a second-time MOCVD method (FIG. 11C).

A resist mask is arranged on both sides in the widthwise direction of the flattening layer 511, and a portion, which belongs to the current light confining layer 509, the current confining layer 510 and the GaAs flattening layer 511 and is located above the ridge portion 513, is removed by etching (FIG. 11D).

The resist mask on the flattening layer 511 is removed. By a third-time MOCVD method, a p-type GaAs contact layer 512 is formed on the cap layer 508, the end surfaces of the current light confining layer 509 and the current confining layer 510 and on the flattening layer 511 (FIG. 11E).

After arranging the p-type electrode 514 on the surface of the contact layer 512 and arranging the n-type electrode 515 on the lower surface of the substrate 501, cleavage is carried out so that the direction perpendicular to the plane of the sheet of FIG. 11E becomes the direction of a preset resonator length, completing a semiconductor laser element.

If a forward bias voltage is applied to the above-mentioned semiconductor laser element, then a current flows inside the ridge portion 513, and a carrier is injected into a center portion in the widthwise direction of the quantum well active layer 504 corresponding to this ridge portion 513, causing laser oscillation. At this time, a reverse bias voltage is applied to an interface between the current light confining layer 509 and the etching stop layer 506 outside the ridge portion 513, and therefore, almost no current flows outside the ridge portion 513.

According to the above-mentioned semiconductor laser element, the etching stop layer 506 is made to be hardly oxidized by forming the etching stop layer 506 on the p-type GaAs second clad layer 505 of p-type GaAs that has an Al composition ratio smaller than that of the second clad layer 505. The current light confining layer 509 is formed by growing AlGaAs of a high-quality crystal on this etching stop layer 506. With this arrangement, photoabsorption and a leak current in the current light confining layer 509 are restrained to make satisfactory the laser oscillation characteristic of the semiconductor laser element. As described above, the semiconductor laser element effects high-output pulse oscillation so as to be used as the light source of an optical disk device that has a high writing speed.

However, the above-mentioned semiconductor laser element has the problem that the rise time and the fall time of the output become comparatively long and the pulse waveform becomes dull when the pulse oscillation is effected with a high output. This dullness of the pulse waveform deteriorates the quality of a signal to be written in an optical disk, causing a read error in reading the signal written in the optical disk. This is ascribed to the following factors.

That is, the speed of rise and fall of the output during the pulse oscillation of a semiconductor laser element as shown in FIG. 10, i.e., the pulse response speed is defined by the internal resistance of the ridge portion 513 and the capacitance of the outside of the ridge portion 513. If the value of product of the resistance value and the capacitance value is reduced, then the above-mentioned response speed is increased. The internal resistance of the ridge portion 513 can be reduced by increasing the carrier density in the third clad layer 507. Moreover, the capacitance of the outside of the ridge portion 513 can be reduced by expanding the width of the depletion layer generated in the interface between the current light confining layer 509 and the etching stop layer 506 when a bias voltage is applied.

FIGS. 12A and 12B are energy band diagrams of the current light confining layer 509 outside the ridge portion 513, the etching stop layer 506 and the second clad layer 505. FIG. 12A shows the energy band diagram when no bias voltage is applied, while FIG. 12B shows the energy band diagram when a bias voltage is applied. The energy bandgap of the etching stop layer 506 is smaller than the energy bandgap of the second clad layer 505. Therefore, when the bias voltage is zero as shown in FIG. 12A, carriers (holes) are accumulated in the etching stop layer 506. On the other hand, if the bias voltage is applied, a depletion layer is formed from the interface between the etching stop layer 506 and the current light confining layer 509. However, since the holes accumulated in the p-type etching stop layer 506 are not extracted, the depletion layer scarcely spreads to the p-type second clad layer 505 as shown in FIG. 12B, and the width of the depletion layer is narrowed. As a result, the capacitance of the outside of the ridge portion 513 increases to slow down the response speed. Consequently, it takes much time for the rise and fall of the output during the pulse oscillation, and the pulse waveform becomes dull. This reduces the quality of the write signal of the optical disk device that employs this semiconductor laser element.

SUMMARY OF THE INVENTION

Accordingly, the object of the present invention is to provide a semiconductor laser element, which has a small capacitance outside the ridge portion and high response speed and is able to effect pulse oscillation with a satisfactory pulse waveform.

In order to achieve the aforementioned object, the present invention provides a semiconductor laser element in which at least a first conductive type first clad layer, an active layer, a second conductive type second clad layer, a second conductive type etching stop layer that has an energy bandgap smaller than that of the second clad layer, a ridge-shaped second conductive type third clad layer and a first conductive type current light confining layer that is arranged on both sides in a widthwise direction of the third clad layer and has a refractive index smaller than a refractive index of the second clad layer are provided on a semiconductor substrate, the semiconductor laser element comprising:

a second conductive type or intrinsic spacer layer arranged in contact with the etching stop layer between the etching stop layer and the current light confining layer.

According to the above-mentioned construction, when a bias voltage is applied to the semiconductor laser element, a depletion layer is generated in an interface between the second conductive type or intrinsic spacer layer and the first conductive type current light confining layer, and this depletion layer spreads into this spacer layer. Therefore, the depletion layer is formed in a region wider than that of the conventional semiconductor laser element in which the depletion layer formation region has been narrowed by the carrier of the etching stop layer. With this arrangement, a capacitance between the spacer layer and the current light confining layer is reduced, and the response speed during the pulse oscillation of the semiconductor laser element is increased. Therefore, the rise time and the fall of the output of the semiconductor laser element become shortened, and the pulse waveform becomes satisfactory. As a result, a semiconductor laser element, the writing speed of which is fast and is suitable for the light source of a high-speed optical disk device, can be provided.

In the semiconductor laser element of one embodiment, the refractive index of the spacer layer is equal to or smaller than the refractive index of the second clad layer.

According to the above-mentioned embodiment, in which the refractive index of the spacer layer is equal to or smaller than the refractive index of the second clad layer, laser light from the active layer is therefore effectively confined in the preset region, providing a satisfactory light confining function. Therefore, the luminous efficiency of the semiconductor laser element is improved.

In the semiconductor laser element of one embodiment, the spacer layer has a carrier density lower than the carrier density of the second clad layer.

According to the above-mentioned embodiment, in which the carrier density of the spacer layer is lower than the carrier density of the second clad layer, the depletion layer is therefore effectively formed when the bias voltage is applied. Therefore, the capacitance between this spacer layer and the current light confining layer is reduced, and this enables the provision of the semiconductor laser element of which the response speed during the pulse oscillation is fast.

In the semiconductor laser element of one embodiment, the carrier density of the spacer layer is not higher than $1\times10^{18}$ cm$^{-3}$.

According to the above-mentioned embodiment, in which the carrier density of the spacer layer is not higher than $1\times10^{18}$ cm$^{-3}$, the depletion layer is therefore properly formed in this spacer layer when the bias voltage is applied. With this arrangement, the capacitance between the spacer layer and the current light confining layer is reduced, and this increases the response speed during the pulse oscillation. If the carrier density is higher than $1\times10^{18}$ cm$^{-3}$, then the depletion layer formation region becomes reduced when the bias voltage is applied, and the capacitance between the spacer layer and the current light confining layer is increased, reducing the response speed during the pulse oscillation.

In the semiconductor laser element of one embodiment, the current light confining layer has in an interfacial portion thereof with respect to the spacer layer a carrier density lower than that of the other portion.

According to the above-mentioned embodiment, in which the current light confining layer has in an interfacial portion thereof with respect to the spacer layer a carrier density lower than that of the other portion, the depletion layer is therefore formed also in the interfacial portion of the current light confining layer when the bias voltage is applied. Therefore, the junction capacitance between the spacer layer and the current light confining layer is effectively reduced, and this allows the pulse response speed of the semiconductor laser element to be increased.

In the semiconductor laser element of one embodiment, the carrier density of the interfacial portion of the current light confining layer with respect to the spacer layer is not higher than $1\times10^{18}$ cm$^{-3}$.

According to the above-mentioned embodiment, in which the carrier density of the interfacial portion of the current light confining layer with respect to the spacer layer is not higher than $1\times10^{18}$ cm$^{-3}$, the depletion layer is therefore properly formed in this interfacial portion when the bias voltage is applied. With this arrangement, the capacitance between the spacer layer and the current light confining layer is reduced, and the response speed during the pulse oscillation is increased. If the carrier density is higher than $1\times10^{18}$ cm$^{-3}$, then the depletion layer formation region when the bias voltage is applied becomes reduced, and the capacitance between the spacer layer and the current light confining layer is increased, reducing the response speed during the pulse oscillation.

In the semiconductor laser element of one embodiment, the spacer layer has a thickness of not smaller than 0.05 $\mu$m and not greater than 0.5 $\mu$m.

According to the above-mentioned embodiment, in which the spacer layer has a thickness of not smaller than 0.05 $\mu$m and not greater than 0.5 $\mu$m, the depletion layer is therefore formed in the proper region when the bias voltage is applied, and the capacitance between the spacer layer and the current light confining layer is effectively reduced, increasing the response speed during the pulse oscillation. If the thickness of the spacer layer is smaller than 0.05 $\mu$m, then the influence from the carrier of the etching stop layer becomes comparatively increased, and the region, where the depletion layer is formed when the bias voltage is applied, is reduced. If the thickness of the spacer layer is greater than 0.5 $\mu$m, then the total thickness of the second clad layer and the spacer layer becomes increased. Consequently, a current expansion in this second clad layer and the spacer layer is caused, and the current injection region to the active layer expands, disadvantageously reducing the luminous efficiency.

In the semiconductor laser element of one embodiment, the spacer layer has a thickness of not smaller than 0.1 $\mu$m and not greater than 0.3 $\mu$m.

According to the above-mentioned embodiment, in which the spacer layer has a thickness of not smaller than 0.1 $\mu$m and not greater than 0.3 $\mu$m, the depletion layer is therefore formed in the more proper region when the bias voltage is applied, and the capacitance between the spacer layer and the current light confining layer is reliably reduced, increasing the response speed during the pulse oscillation. For example, if the carrier density of the spacer layer is not higher than $1 \times 10^{18}$ cm$^{-3}$, then the thickness of the depletion layer formation region becomes greater than 0.1 $\mu$m. Therefore, by setting the thickness of the spacer layer greater than 0.1 $\mu$m, the depletion layer can be formed in the spacer layer. Moreover, by setting the thickness smaller than 0.3 $\mu$m, the current expansion in the second clad layer and the spacer layer is reliably prevented, and the expansion of the current injection region to the active layer is avoided to allow the luminous efficiency of the semiconductor laser element to be satisfactory.

In the semiconductor laser element of one embodiment, the interfacial portion of the current light confining layer with respect to the spacer layer has a thickness of not smaller than 0.05 $\mu$m and not greater than 0.5 $\mu$m.

According to the above-mentioned embodiment, in which the interfacial portion of the current light confining layer with respect to the spacer layer has a thickness of not smaller than 0.05 $\mu$m and not greater than 0.5 $\mu$m, the depletion layer generated when the bias voltage is applied is therefore effectively formed also in the interfacial portion of the current light confining layer in addition to the spacer layer. The junction capacitance between the spacer layer and the current light confining layer is reliably reduced, and the response speed during the pulse oscillation is increased. If the thickness of the interfacial portion of the current light confining layer with respect to the spacer layer is smaller than 0.05 $\mu$m, then the depletion layer generated when the bias voltage is applied is hardly formed in the current light confining layer, and the amount of reduction of the junction capacitance is therefore reduced. If the thickness of the interfacial portion of the current light confining layer is greater than 0.5 $\mu$m, when the impurity diffuses from the spacer layer to the current light confining layer side, then the impurity diffuses to the above-mentioned interfacial portion whose carrier density is comparatively low, and the current confining function of the current light confining layer is disadvantageously reduced.

In the semiconductor laser element of one embodiment, the spacer layer is doped with an impurity that mainly contains carbon.

According to the above-mentioned embodiment, the spacer layer is doped with an impurity that mainly contains carbon. The carbon hardly thermally diffuses, and therefore, the carbon hardly diffuses from the spacer layer to other layers even if the temperature rises during the crystal growth in the spacer layer and other layers. Therefore, the spacer layer can obtain a carrier density of the desired value. Moreover, the other layers put in contact with the spacer layer receive almost no influence of the diffusion of the impurity, and therefore, a semiconductor laser element capable of effecting pulse oscillation with quick response is stably obtained.

In the semiconductor laser element of one embodiment, the etching stop layer put in contact with the spacer layer is doped with an impurity that mainly contains carbon.

According to the above-mentioned embodiment, the etching stop layer put in contact with the spacer layer is doped with carbon. The carbon hardly thermally diffuses, and therefore, the carbon hardly diffuses into the spacer layer even if the temperature rises during the crystal growth. Therefore, the spacer layer can obtain a carrier density of the desired value, and this enables the semiconductor laser element capable of effecting pulse oscillation with quick response to be stably obtained.

In the semiconductor laser element of one embodiment, the second clad layer is doped with an impurity that mainly contains carbon at least on the spacer layer side.

According to the above-mentioned embodiment, the second clad layer is doped with an impurity that mainly contains carbon at least on the spacer layer side. The carbon hardly thermally diffuses, and therefore, the carbon hardly diffuses into the spacer layer even if the temperature rises during the crystal growth. Therefore, the spacer layer can obtain a carrier density of the desired value, and this enables the semiconductor laser element capable of effecting pulse oscillation with quick response to be stably obtained.

In the semiconductor laser element of one embodiment, the second clad layer is doped mainly with an impurity other than carbon in its portion put in contact with the active layer.

Since the carbon is hardly activated, it is difficult to secure the carrier density. Therefore, according to the above-mentioned embodiment, the carrier density can be increased by doping the portion that belongs to the second clad layer and is put in contact with the active layer mainly with an impurity other than carbon, and the carrier leak from the active layer at high temperature is prevented, obtaining high reliability.

In the semiconductor laser element of one embodiment, the second clad layer has in its portion put in contact with the active layer a carrier density higher than the carrier density of its portion put in contact with the spacer layer.

According to the above-mentioned embodiment, by increasing the carrier density in the portion that belongs to the second clad layer and is put in contact with the active layer, the carrier leak from the active layer at high temperature is prevented, obtaining high reliability. At the same time, the carrier density in the portion that belongs to the second clad layer and is put in contact with the spacer layer is low, and therefore, the dopant of the second clad layer hardly diffuses to the spacer. Therefore, the spacer layer can obtain the desired carrier density, and this enables the semiconductor laser element capable of effecting pulse oscillation with quick response to be stably obtained.

In the semiconductor laser element of one embodiment, the current light confining layer is doped with an impurity that mainly contains silicon.

According to the above-mentioned embodiment, the current light confining layer is doped with an impurity that mainly contains silicon. The silicon hardly thermally diffuses, and therefore, the impurity containing mainly silicon hardly diffuses from the current light confining layer to other layers even if the temperature rises during the crystal growth in the current light confining layer and other layers. Therefore, the current light confining layer can obtain a carrier density of the desired value. Moreover, the other layers put in contact with the current light confining layer receive almost no influence of the diffusion of the impurity, and therefore, a semiconductor laser element capable of effecting pulse oscillation with quick response is stably obtained.

In the semiconductor laser element of one embodiment, the etching stop layer does not contain Al.

According to the above-mentioned embodiment, in which the etching stop layer does not contain Al, the spacer layer grown as a crystal on this etching stop layer and the current light confining layer grown as a crystal on this spacer layer therefore have a little crystal defect. Accordingly, there is a little crystal defect also in the interface between the spacer layer and the current light confining layer. Therefore, the travel speed of the carrier when the bias voltage is applied is not reduced by the crystal defect, and this enables the provision of the semiconductor laser element of which the response speed during the pulse oscillation is fast.

In the semiconductor laser element of one embodiment, the etching stop layer has a thickness of not smaller than 10 Å and not greater than 200 Å.

According to the above-mentioned embodiment, in which the etching stop layer has a thickness of not smaller than 10 Å and not greater than 200 Å, this etching stop layer therefore has a quantum size effect, and the energy level of the carrier in the etching stop layer is increased. Accordingly, the etching stop layer has a little barrier to the carrier movement when the bias voltage is applied. Therefore, the carrier can move at high speed, and the response speed during the pulse oscillation of the semiconductor laser element becomes fast.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below on the basis of the embodiments thereof.

(First Embodiment)

Figure 1:
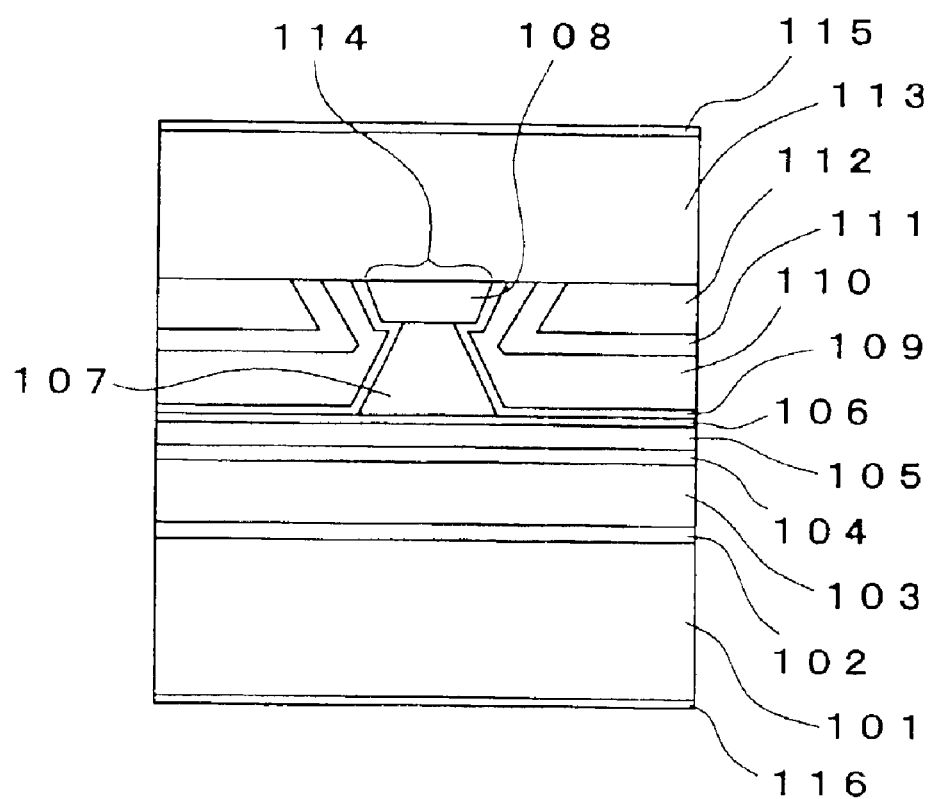
FIG. 1 is a view showing a semiconductor laser element according to a first embodiment of the present invention.

FIG. 1 is a view showing the semiconductor laser element of the first embodiment of the present invention. In this semiconductor laser element, an n-type GaAs buffer layer 102, an n-type $Al_{0.5}Ga_{0.5}As$ first clad layer 103, an MQW active layer 104, a p-type $Al_{0.5}Ga_{0.5}As$ second clad layer 105 and a p-type GaAs etching stop layer 106 are successively laminated on an n-type GaAs substrate 101. A ridge-shaped p-type $Al_{0.5}Ga_{0.5}As$ third clad layer 107 and a p-type GaAs protective layer 108 are provided on this etching stop layer 106. The ridge-shaped p-type $Al_{0.5}Ga_{0.5}As$ third clad layer 107 and the p-type GaAs protective layer 108 constitute a ridge portion 114 extended in the direction of a resonator. A p-type $Al_{0.7}Ga_{0.3}As$ spacer layer 109 is provided on both sides in the widthwise direction of this ridge portion 114. An n-type $Al_{0.7}Ga_{0.3}As$ current light confining layer 110, an n-type GaAs current confining layer 111 and a p-type GaAs flattening layer 112 are laminated on this spacer layer 109. A p-type GaAs contact layer 113 is formed on the protective layer 108, on the end surfaces of the spacer layer 109, the current light confining layer 110 and the current confining layer 111 and on the flattening layer 112. A p-type electrode 115 is arranged on the p-type contact layer 113, and an n-type electrode 116 is arranged on the lower surface of the n-type GaAs substrate 101.

The n-type GaAs substrate 101 is doped with a dopant of Si and has a carrier density of $2 \times 10^{18}$ cm$^{-3}$. The n-type GaAs buffer layer 102 has a layer thickness of 0.5 μm, a dopant of Si and a carrier density of $1 \times 10^{18}$ cm$^{-3}$. The n-type $Al_{0.5}Ga_{0.5}As$ first clad layer 103 has a layer thickness of 2 μm, a dopant of Si and a carrier density of $5 \times 10^{17}$ cm$^{-3}$. The MQW active layer 104 is formed by interposing a non-doped multiple quantum well structure, in which a barrier layer of one layer and well layers of two layers are alternately laminated, between light guide layers. The well layer is made of $Al_{0.1}Ga_{0.9}As$ and has a layer thickness of 0.008 μm. The barrier layer is made of $Al_{0.3}Ga_{0.7}As$ and has a layer thickness of 0.005 μm. The light guide layer is made of $Al_{0.3}Ga_{0.7}As$ and has a layer thickness of 0.03 μm. The p-type $Al_{0.5}Ga_{0.5}As$ second clad layer 105 has a layer thickness of 0.2 μm. Its portion, which is put in contact with the active layer 104 and has a thickness of 0.1 μm, has a dopant of Zn and a carrier density of $1 \times 10^{18}$ cm$^{-3}$. A portion, which is other than the portion put in contact with the active layer 104 of the p-type second clad layer 105 and has a thickness of 0.1 μm, has a dopant of C and a carrier density of $3 \times 10^{17}$ cm$^{-3}$. The p-type GaAs etching stop layer 106 has a layer thickness of 0.003 μm, a dopant of C and a carrier density of $3\times10^{17}$ cm$^{-3}$. The p-type Al$_{0.5}$Ga$_{0.5}$As third clad layer 107 has a layer thickness of 1.3 μm, a dopant of Zn and a carrier density of $2\times10^{18}$ cm$^{-3}$. The p-type GaAs protective layer 108 has a layer thickness of 0.7 μm, a dopant of Zn and a carrier density of $3\times10^{18}$ cm$^{-3}$. The p-type Al$_{0.7}$Ga$_{0.3}$As spacer layer 109 has a layer thickness of 0.2 μm, a dopant of C and a carrier density of $3\times10^{17}$ cm$^{-3}$. The n-type Al$_{0.7}$Ga$_{0.3}$As current light confining layer 110 has a dopant of Si and a layer thickness of 1.0 μm. In this current light confining layer 110, an interfacial portion, which is a portion located between an interface put in contact with the spacer layer 109 and a surface located apart by 0.2 μm from this interface, is formed to have a carrier density of $3\times10^{17}$ cm$^{-3}$. A portion, which belongs to this current light confining layer 110 and is other than the above-mentioned interfacial portion, i.e., a portion, which is located between the upper surface of the interfacial portion and the upper surface of the current light confining layer 110 and has a thickness of 0.8 μm, is formed to have a carrier density of $1\times10^{18}$ cm$^{-3}$. The n-type GaAs current confining layer 111 has a dopant of Si, a layer thickness of 0.3 μm and a carrier density of $2\times10^{18}$ cm$^{-3}$. The p-type GaAs flattening layer 112 is formed to have a dopant of Zn, a layer thickness of 0.5 μm and a carrier density of $2\times10^{18}$ cm$^{-3}$. The p-type GaAs contact layer 113 has a dopant of Zn, a layer thickness of 5 μm and a carrier density of $5\times10^{18}$ cm$^{-3}$.

Figure 2A:
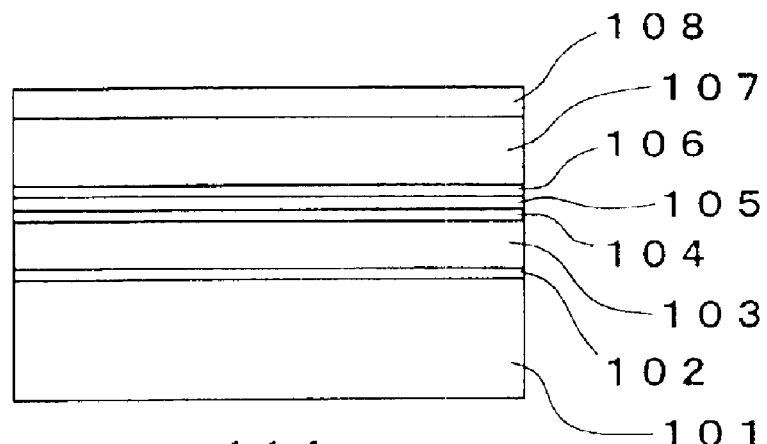
FIGS. 2A, 2B, 2C, 2D and 2E are views sequentially showing the processes of fabricating the semiconductor laser element of the first embodiment.

The above-mentioned semiconductor laser element is fabricated as follows. That is, as shown in FIG. 2A, the buffer layer 102, the first clad layer 103, the MQW active layer 104, the second clad layer 105, the etching stop layer 106, the third clad layer 107 and the protective layer 108 are successively epitaxially grown on the substrate 101 by the first-time MOCVD method.

Figure 2B:
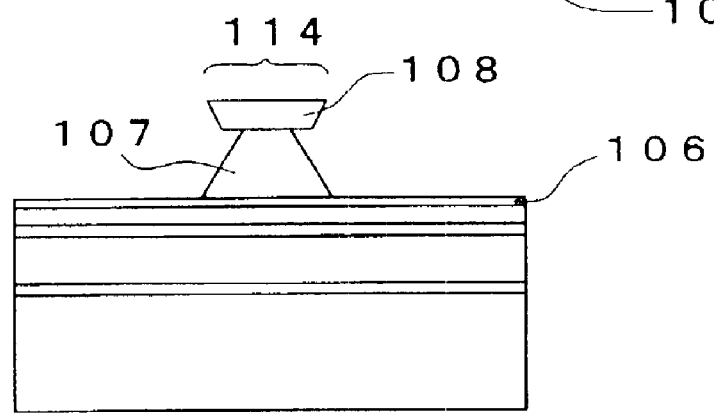

Next, a stripe-shaped resist mask, which extends in the [011] direction, is formed on the protective layer 108. The protective layer 108 and the third clad layer 107 are etched to the etching stop layer 106, forming a stripe-shaped ridge portion 114 that has a width of 2.5 μm and extends in the [011] direction (FIG. 2B).

Figure 2C:
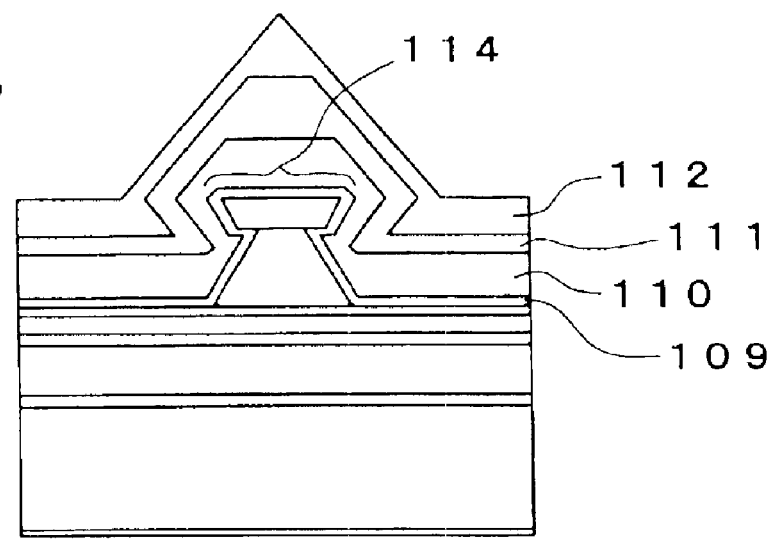

Subsequently, the resist mask on the protective layer 108 is removed, and the spacer layer 109, the current light confining layer 110, the current confining layer 111 and the flattening layer 112 are grown on the etching stop layer 106 and the ridge portion 114 by the second-time MOCVD method (FIG. 2C).

In this case, when growing a crystal of a high Al crystal mixture ratio by the MOCVD method, carbon when an organic metal is decomposed is mixed in the grown crystal. Therefore, carbon is mixed in the non-doped GaAs etching stop layer 106 and the AlGaAs second clad layer 105 even if no impurity is added, and a p-type semiconductor having a carrier density of about $3\times10^{17}$ cm$^{-3}$ is formed. Moreover, carbon is mixed in the non-doped AlGaAs spacer layer 109 even if no impurity is added, and a p-type semiconductor having a carrier density of about $3\times10^{17}$ cm$^{-3}$ is formed.

Figure 2D:
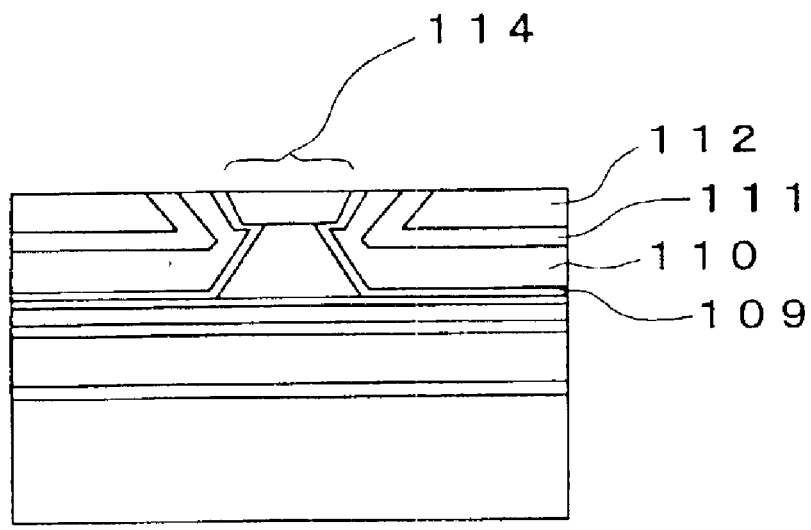

Subsequently, a resist mask is formed on both sides in the widthwise direction of the flattening layer 112 by photolithography. Thereafter, a portion which is located above the ridge portion 114, and belongs to the spacer layer 109, the current light confining layer 110, the current confining layer 111 and the GaAs flattening layer 112 is selectively removed by etching (FIG. 2D).

Figure 2E:
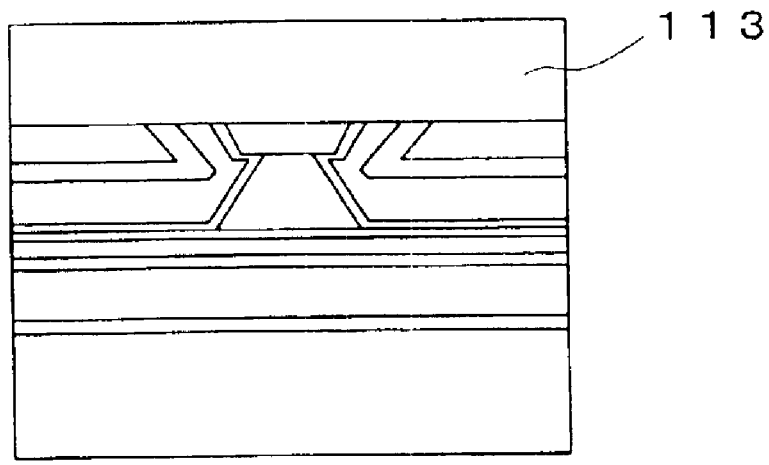

The resist mask on the flattening layer 112 is removed, and a contact layer 113 is formed on the protective layer 108, an end surface of the spacer layer 109, an end surface of the current light confining layer 110, an end surface of the current confining layer 111 and the flattening layer 112 by the third-time MOCVD method (FIG. 2E).

Thereafter, by arranging a p-electrode 115 on the upper surface of the contact layer 113 and arranging an n-electrode 116 on the lower surface of the semiconductor substrate 101, a laminate is completed (FIG. 1).

This laminate is cleaved to a resonator length of 800 μm with the direction perpendicular to the plane of the sheet of FIG. 2E as a resonator direction. Thereafter, the cleaved one end surface is coated with an Al$_2$O$_3$ film by the electron-beam deposition technique, setting the reflectance of this cleaved end surface to about 12%. The other cleaved end surface is coated with a multilayer in which an Al$_2$O$_3$ film and an amorphous Si film are alternately laminated, setting the reflectance of this cleaved end surface to about 95%. Thus, a semiconductor laser element of the end emission type is completed.

The semiconductor laser element fabricated as described above had a starting current of 33 mA, an I-L slope efficiency of 1 W/A and a driving temperature of 70° C. and stably effected laser oscillation by 150-mW pulse drive.

Figure 3A:
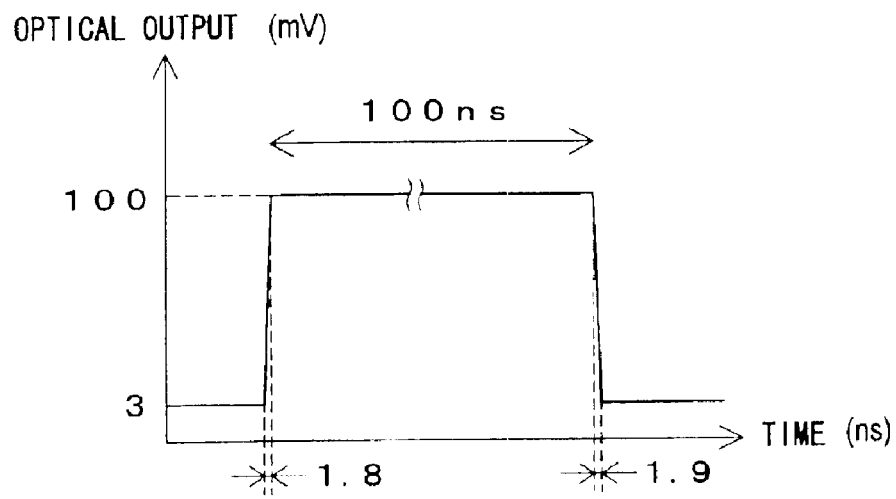
FIG. 3A is a graph showing an output waveform when the semiconductor laser element of the first embodiment effects pulse oscillation.
Figure 3B:
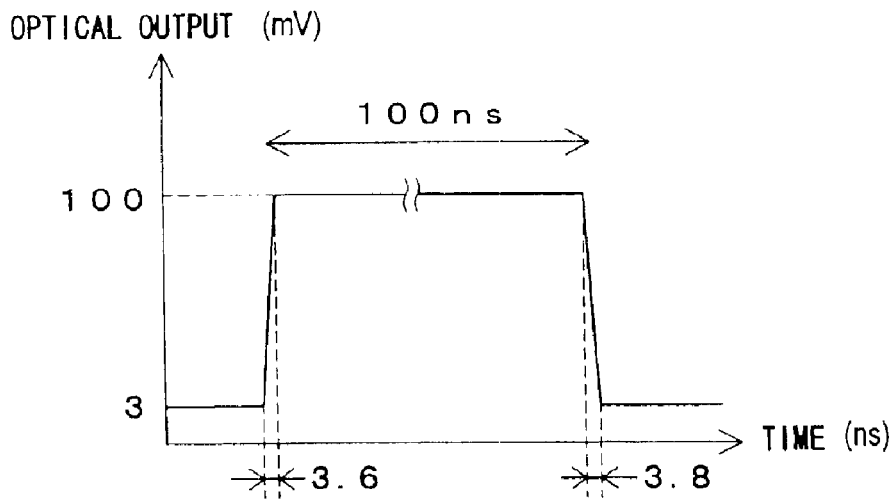
FIG. 3B is a graph showing an output waveform when a conventional semiconductor laser element effects pulse oscillation.
Figure 10:
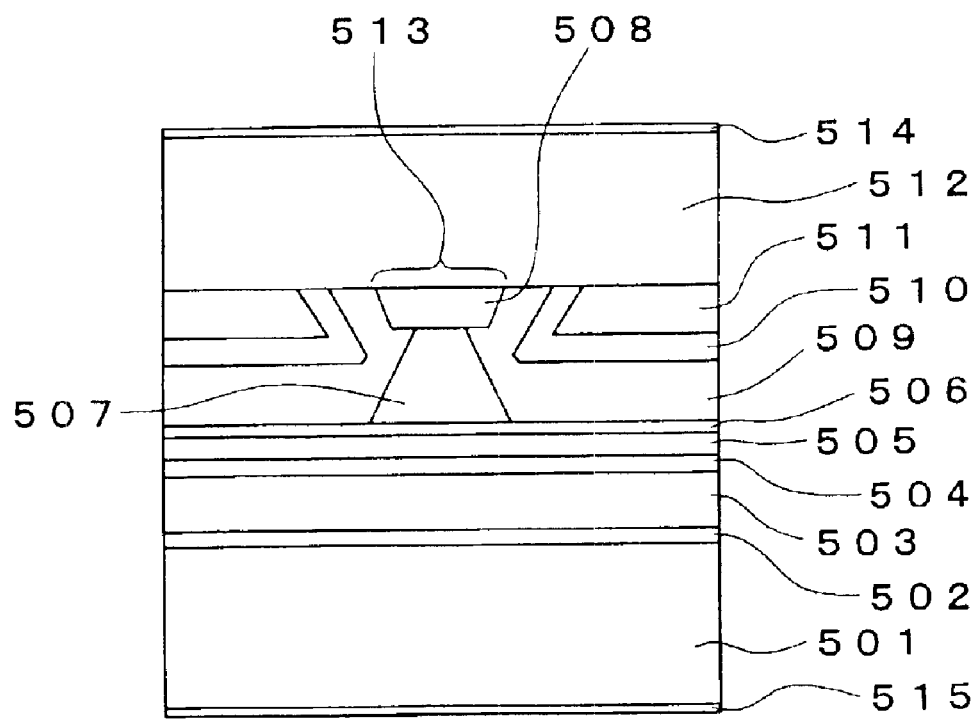
FIG. 10 is a view showing the conventional semiconductor laser element.
Figure 11A:
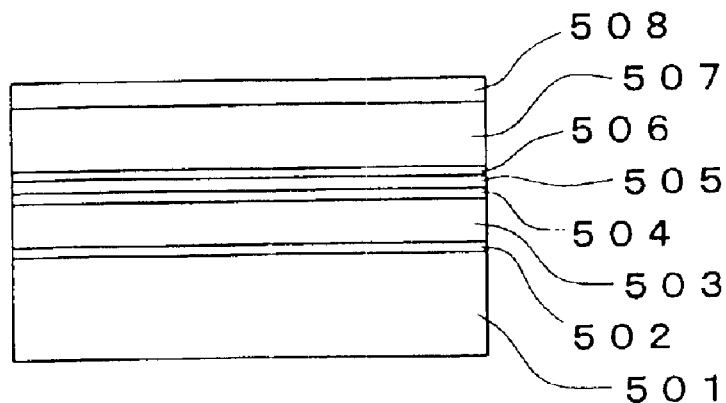
FIGS. 11A, 11B, 11C, 11D and 11E are views sequentially showing the processes of fabricating the conventional semiconductor laser element.
Figure 11B:
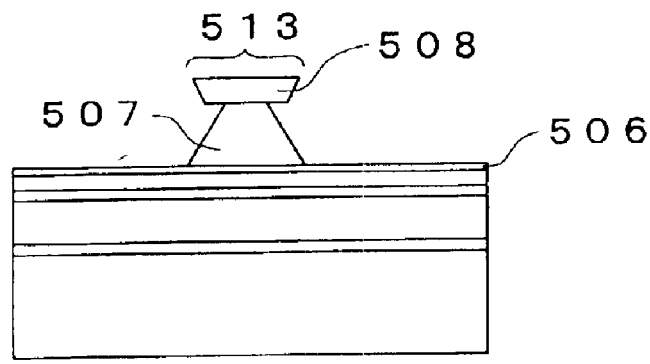
Figure 11C:
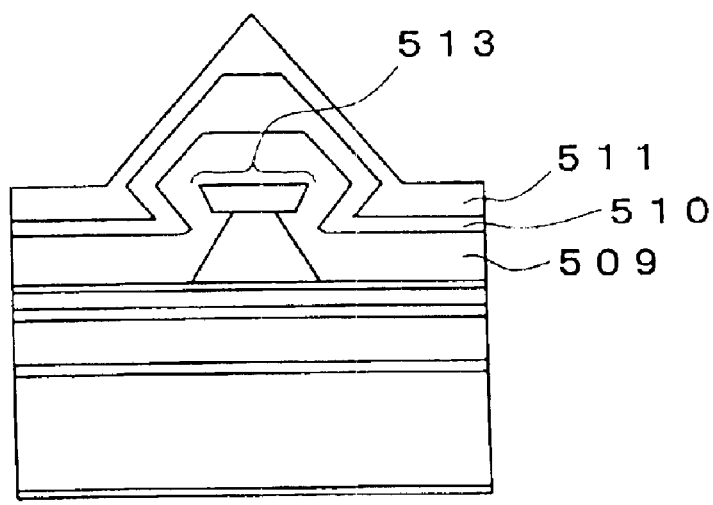
Figure 11D:
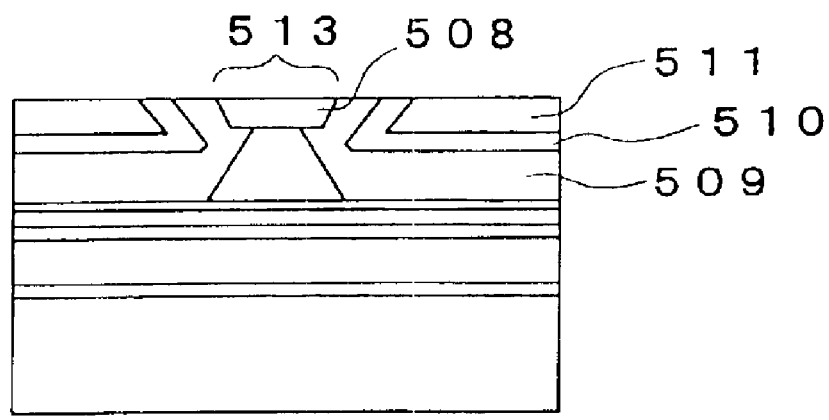
Figure 11E:
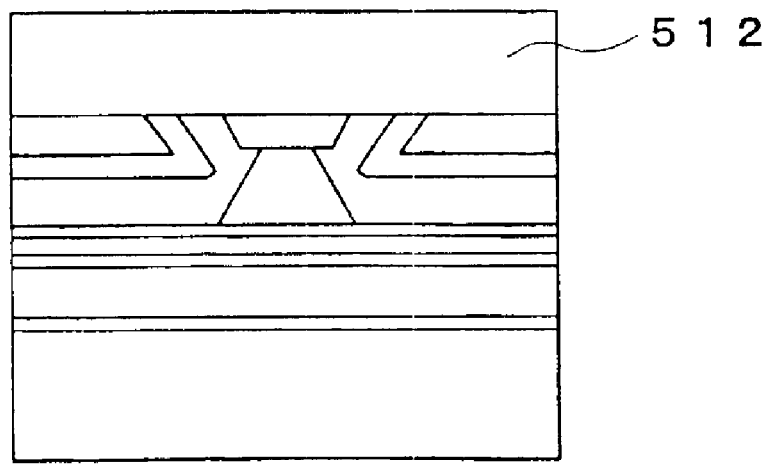
Figure 12A:
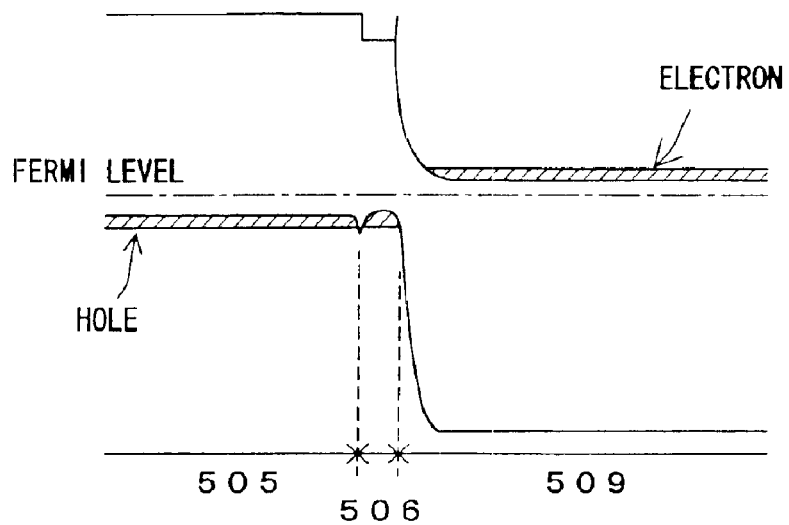
FIG. 12A is an energy band diagram of a current light confining layer outside a ridge portion, an etching stop layer and a second clad layer when the bias voltage is zero.
Figure 12B:
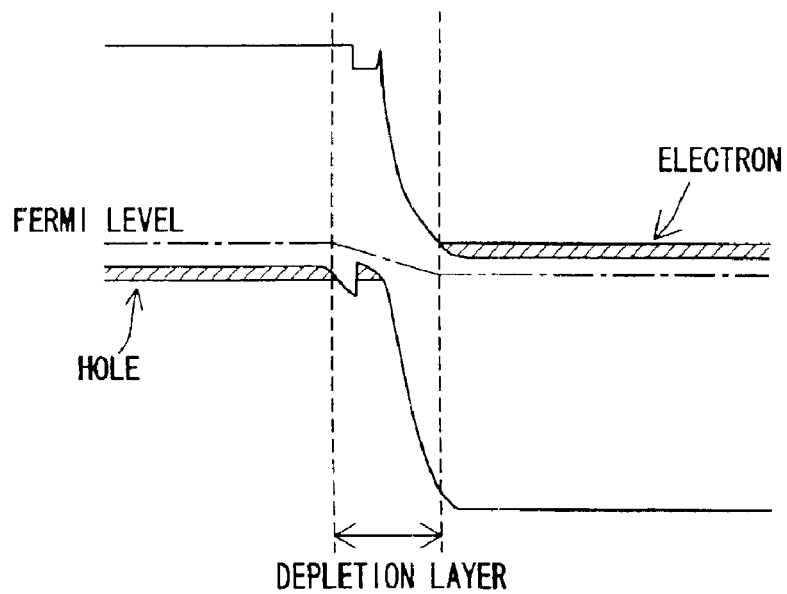
FIG. 12B is an energy band diagram when the bias voltage is applied.

FIG. 3A shows an output waveform when this semiconductor laser element is driven to effect pulse oscillation by a pulse current that has a pulse width of 100 ns, a duty ratio of 50%, a top current of 180 mA and a bottom current of 33 mA. As shown in FIG. 3A, the pulse rise time was 1.8 ns, and the pulse fall time was 1.9 ns. For the sake of comparison, FIG. 3B shows an output waveform when the conventional semiconductor laser element shown in FIG. 10 is driven by pulse on the same conditions. This conventional semiconductor laser element had a pulse rise time of 3.6 ns and a pulse fall time of 3.8 ns. As described above, the semiconductor laser element of the present embodiment is able to have shorter pulse rise time and pulse fall time than in the conventional semiconductor laser element and consequently has a satisfactory pulse waveform. Therefore, when this semiconductor laser element is employed for the light source of an optical disk device, a signal can be written into an optical disk with good quality.

Figure 4A:
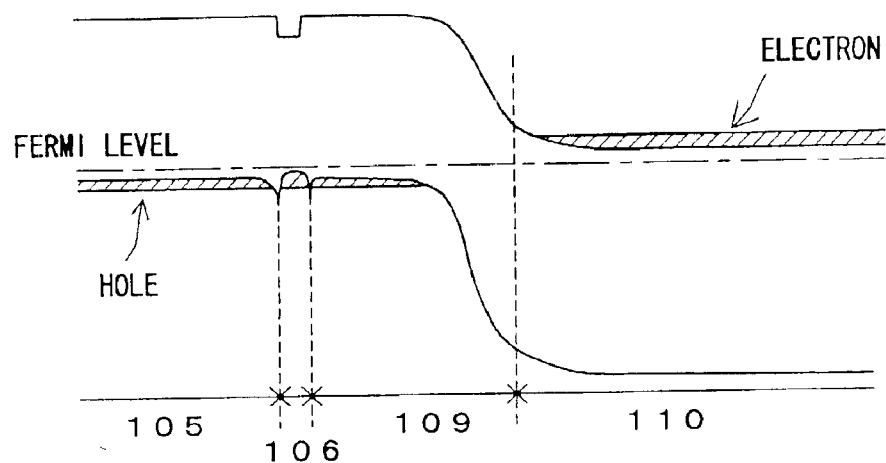
FIG. 4A is a schematic energy band diagram outside a ridge portion when the bias voltage applied to the semiconductor laser element is zero.
Figure 4B:
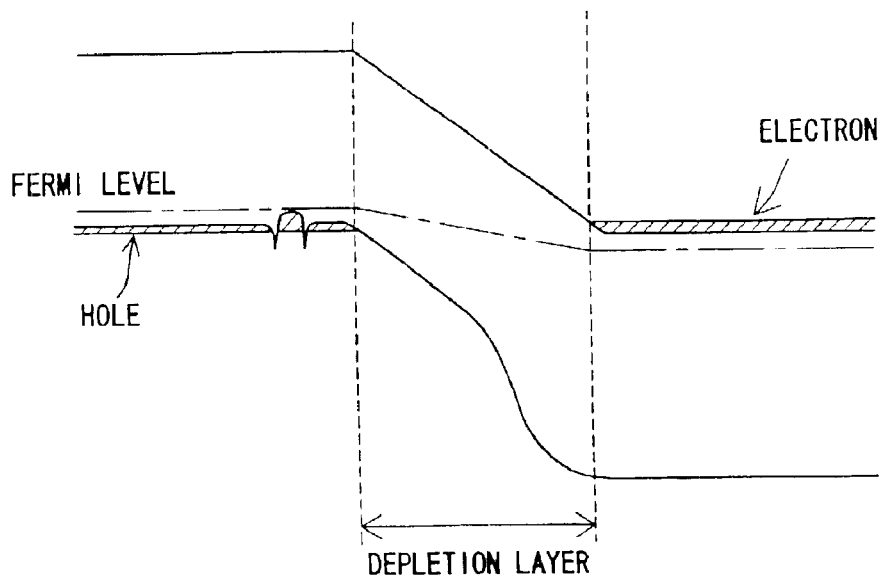
FIG. 4B is a schematic energy band diagram outside the ridge portion when a predetermined bias voltage is applied.

It is presumable that the improvement in the response characteristics during the pulse oscillation of this semiconductor laser element is ascribed to the following reasons. FIGS. 4A and 4B are the schematic energy band diagrams of the outside of the ridge portion 114 of the semiconductor laser element, showing the energy band diagrams of the n-type current light confining layer 110, the p-type spacer layer 109, the p-type etching stop layer 106 and the p-type second clad layer 105. FIG. 4A is the diagram when the bias voltage applied to the semiconductor laser element is zero, while FIG. 4B is the diagram when a predetermined bias voltage is applied. When the bias current is zero, carriers are accumulated inside the etching stop layer 106 placed between the second clad layer 105 and the spacer layer 109. Thereafter, if a forward bias voltage is applied to the semiconductor laser element, then a reverse bias voltage is applied to a p-n junction plane that is the interface between the p-type spacer layer 109 and the n-type current light confining layer 110, forming a depletion layer. At this time, the p-n junction plane is separated from the etching stop layer 106 via the spacer layer 109. Therefore, as shown in FIG. 4B, the depletion layer sufficiently spreads into the spacer layer 109 without receiving the influence of the carriers existing inside the etching stop layer 106. By this operation, the capacitance of the outside of the ridge portion 114 is reduced. The capacitance of this semiconductor laser element was 50 pF, and the capacitance of the conventional semiconductor laser element of FIG. 10 was 100 pF. That is, the capacitance of the semiconductor laser element of the present embodiment can be reduced to about half the capacitance of the conventional semiconductor laser element, and the response speed of the semiconductor laser element can be made fast. As a result, the pulse rise time and the pulse fall time can be shortened to allow the formation of a pulse waveform of a satisfactory shape.

In the semiconductor laser element of the present embodiment, the refractive index of the spacer layer 109 is smaller than that of the second clad layer 105. Accordingly, this spacer layer 109 has a light confining function to effectively confine light from the active layer 104 in the second clad layer 105. Therefore, the luminous efficiency of the semiconductor laser element can effectively be improved.

Moreover, the semiconductor laser element is configured so that the carrier density of the spacer layer 109 is set to $1 \times 10^{18}$ cm$^{-3}$, which is lower than the carrier density of the second clad layer 105. Moreover, the thickness of the spacer layer 109 is set to 0.2 μm. Therefore, the depletion layer can effectively be spread to the spacer layer 109 side when the bias voltage is applied. Therefore, the junction capacitance of the p-type spacer layer 109 and the n-type current light confining layer 110 outside the ridge portion 114 can effectively be reduced, and the response speed during the pulse oscillation can further be increased.

Moreover, the aforementioned semiconductor laser element is configured so that the carrier density of the interfacial portion, which belongs to the current light confining layer 110 and is put in contact with the spacer layer 109, is set to $1 \times 10^{18}$ cm$^{-3}$, which is lower than that of the other portion of the current light confining layer 110. Accordingly, the depletion layer formed when the bias voltage is applied can be spread to the current light confining layer 110 side. As a result, the junction capacitance of the p-type spacer layer 109 and the n-type current light confining layer 110 can effectively be reduced, and the response speed can further be increased.

Moreover, the aforementioned semiconductor laser element contains carbon generated through the decomposition of the organic metal during the crystal growth by the MOCVD method as it is in the spacer layer 109. This carbon scarcely diffuses to the other semiconductor layers even at high temperature. Therefore, the carbon concentration of the spacer layer 109 is set approximately to the concentration as preset, and this allows the semiconductor laser element of a quick response to be stable and to be fabricated easily.

Moreover, the aforementioned semiconductor laser element mainly includes carbon in the etching stop layer 106 and in a portion, which has a thickness of 0.1 μm, belongs to the second clad layer 105 and is located on the spacer layer 109 side. This carbon scarcely diffuses to the other semiconductor layers even at high temperature. Therefore, the carbon concentration of the spacer layer 109 is set approximately to the concentration as predetermined, and this allows the semiconductor laser element of a quick response to be stable and to be fabricated easily.

Furthermore, the second clad layer 105 is doped mainly with an impurity other than carbon in the portion thereof put in contact with the active layer 104. Because carbon is hard to activate, it is difficult to secure the carrier density. By doping the portion, which belongs to the second clad layer 105 and is put in contact with the active layer 104, mainly with an impurity other than carbon, the carrier density can be increased, and high reliability can be obtained with the carrier leak from the active layer 104 prevented at high temperature.

Furthermore, the carrier density of the portion, which belongs to the second clad layer 105 and is put in contact with the active layer 104, is higher than the carrier density of the portion put in contact with the spacer layer 109. By increasing the carrier density of the portion that belongs to the second clad layer 105 and is put in contact with the active layer 104, high reliability can be obtained with the carrier leak from the active layer 104 prevented at high temperature. At the same time, the carrier density of the portion, which belongs to the second clad layer 105 and is put in contact with spacer layer 109, is low, and therefore, the dopant in the second clad layer 105 hardly diffuses to the spacer layer 109. Therefore, the spacer layer 109 can obtain the desired carrier density, and therefore, this enables the semiconductor laser element capable of effecting pulse oscillation with quick response to be stably obtained.

Moreover, in the semiconductor laser element, the etching stop layer 106 does not contain Al (aluminum), and therefore, the spacer layer 109 and the current light confining layer 110 grown as crystals on this etching stop layer 106 are able to have a reduced amount of crystal defects. Therefore, the carrier travel speed when the bias voltage is applied is maintained at high speed, and this enables the semiconductor laser element of which the response speed during the pulse oscillation is high to be provided.

Moreover, in the aforementioned semiconductor laser element, the etching stop layer 106 has a thickness of 30 Å. Therefore, this etching stop layer 106 can produce a quantum size effect to allow the energy level of the carrier in the etching stop layer to be increased. Therefore, the etching stop layer 106 has a little barrier to the carrier movement when the bias voltage is applied. Therefore, the carrier can be moved at high speed, and the response speed during the pulse oscillation of the semiconductor laser element can be increased.

In the present embodiment, the semiconductor laser element is formed by using the AlGaAs-based compound semiconductor. However, it is acceptable to use an AlGaInP-based compound semiconductor or an InGaAsP-based compound semiconductor besides it.

(Second Embodiment)

Figure 5:
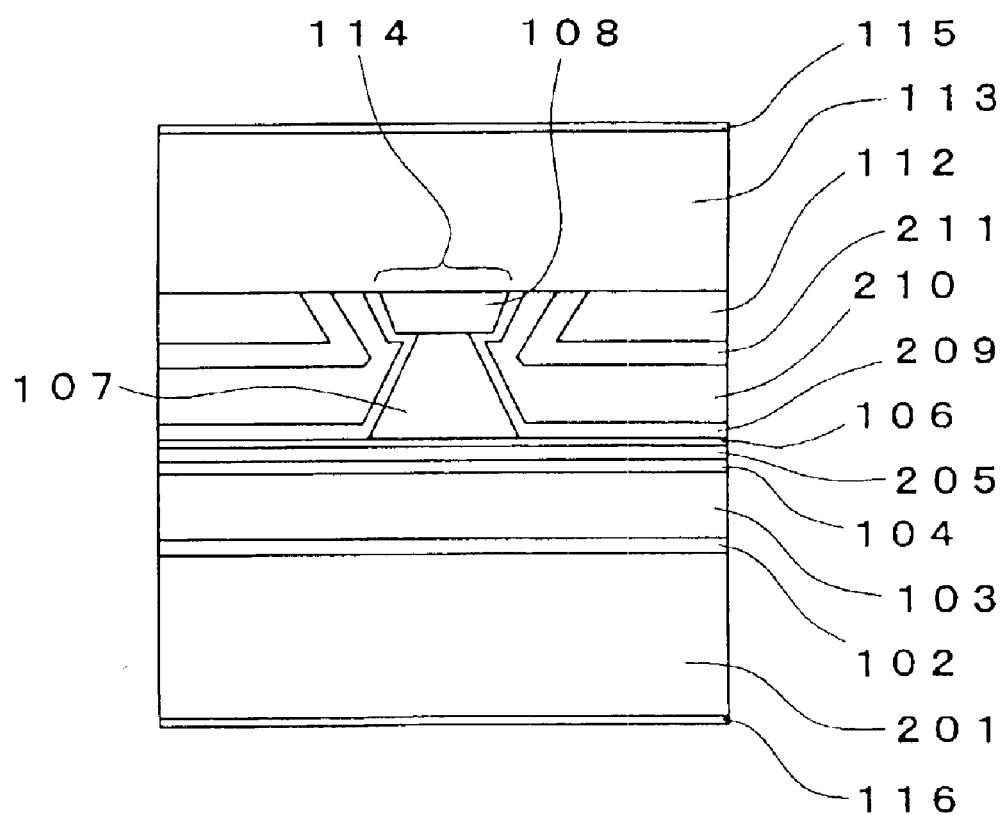
FIG. 5 is a view showing a semiconductor laser element according to a second embodiment of the present invention.

FIG. 5 is a view showing the semiconductor laser element of the second embodiment of the present invention. This semiconductor laser element differs from the semiconductor laser element of the first embodiment only in the carrier density of the substrate, the layer thickness of the second clad layer, the impurity contained mainly in this second clad layer, the impurity contained mainly in the etching stop layer, the dopant, layer thickness and carrier density of the spacer layer, the carrier density of the current light confining layer and the layer thickness of the current confining layer. The same portions as those of the semiconductor laser element of the first embodiment are denoted by same reference numerals, and no detailed description is provided therefor.

In the semiconductor laser element of the present embodiment, an n-type GaAs substrate 201 has a carrier density of $1 \times 10^{18}$ cm$^{-3}$. A p-type Al$_{0.5}$Ga$_{0.5}$As second clad layer 205 has a layer thickness of 0.1 μm. A p-type spacer layer 209 is constructed of Al$_{0.5}$Ga$_{0.5}$As and has a dopant of Zn, a layer thickness of 0.1 μm and a carrier density of $5 \times 10^{17}$ cm$^{-3}$. An n-type Al$_{0.7}$Ga$_{0.3}$As current light confining layer 210 contains a dopant of Si. An interfacial portion of the current light confining layer 210, which has a thickness of 0.1 μm from the interface facing the spacer layer 209, has a carrier density of $5 \times 10^{17}$ cm$^{-3}$. The portion other than the interfacial portion has a layer thickness of 0.9 μm and a carrier density of 1×10$^{18}$ cm$^{-3}$. An n-type GaAs current confining layer 211 is formed to have a layer thickness of 0.4 μm.

This semiconductor laser element had an oscillation starting current of 29 mA, an I-L slope efficiency of 1W/A and a driving temperature of 70° C. and stably effected laser oscillation with 150-mW pulse drive. When this semiconductor laser element was driven by a pulse current that had a pulse width of 100 ns, a duty ratio of 50%, a top current of 180 mA and a bottom current of 33 mA, a satisfactory output pulse waveform that had a pulse rise time of 1.8 ns and a pulse fall time of 1.9 ns was obtained.

In this semiconductor laser element, the refractive index of the p-type spacer layer 209 is made equal to the refractive index of the p-type second clad layer 205. Therefore, by setting the total layer thickness of the p-type spacer layer 209 and the p-type second clad layer 205 approximately equal to the layer thickness of the second clad layer of the conventional semiconductor laser element, it is enabled to prevent the spread of current through the p-type spacer layer 209 and the p-type second clad layer 205 and effectively prevent the increase in the oscillation threshold current.

Moreover, the spacer layer 209 and the second clad layer 205, which are positioned on the upper and lower sides, respectively, with interposition of the etching stop layer 106, are formed of same p-type Al$_{0.5}$Ga$_{0.5}$As and made to have same energy bandgap. With this arrangement, almost no energy barrier occurs against the carrier that moves across the etching stop layer 106 when the bias voltage is applied. As a result, it is enabled to move the carrier toward the active layer at high speed and further increase the response speed of the semiconductor laser element.

In the present embodiment, the semiconductor laser element is formed by using the AlGaAs-based compound semiconductor. However, it is acceptable to use an AlGaInP-based compound semiconductor or an InGaAsP-based compound semiconductor besides it.

(Third Embodiment)

Figure 6:
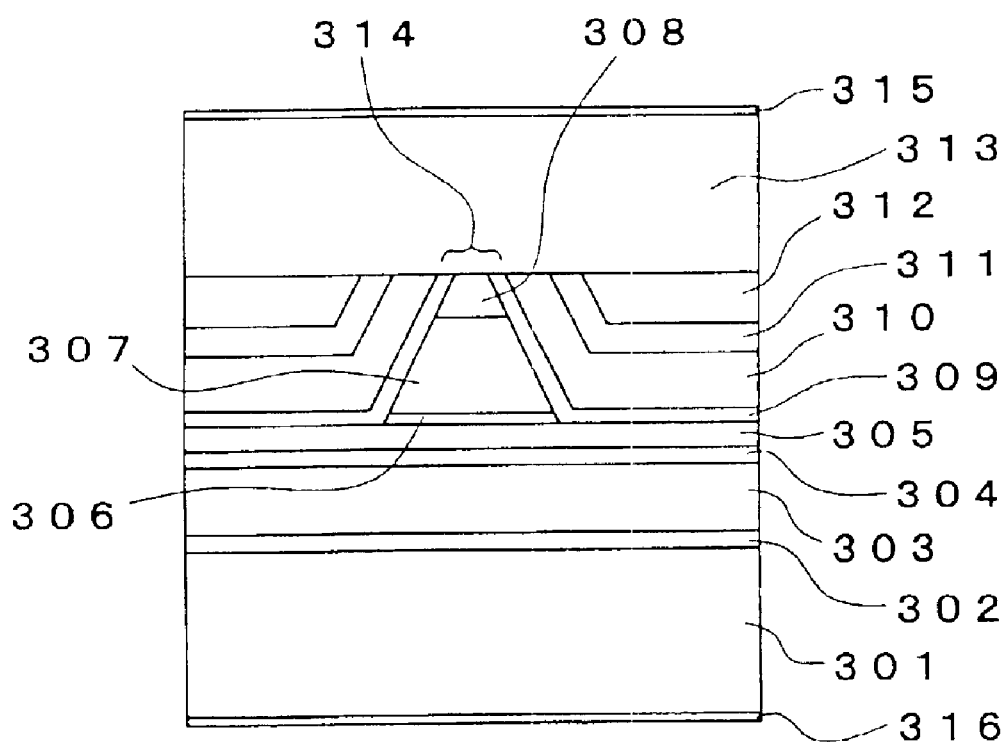
FIG. 6 is a view showing a semiconductor laser element according to a third embodiment of the present invention.

FIG. 6 is a view showing the semiconductor laser element of the third embodiment of the present invention. In this semiconductor laser element, an n-type GaAs buffer layer 302, an n-type (Al$_{0.7}$Ga$_{0.3}$)InP first clad layer 303, an MQW active layer 304 and a p-type (Al$_{0.7}$Ga$_{0.3}$)InP second clad is layer 305 are successively laminated on an n-type GaAs substrate 301. A p-type GaInP etching stop layer 306 is formed to have a predetermined width at the center in the widthwise direction on this p-type second clad layer 305. A ridge-shaped p-type (Al$_{0.7}$Ga$_{0.3}$)InP third clad layer 307 and a p-type GaAs protective layer 308 are provided on this etching stop layer 306. The etching stop layer 306, the third clad layer 307 and the protective layer 308 constitute a ridge portion 314 extended in the direction of resonator. A p-type AlInP spacer layer 309 is provided on both sides in the widthwise direction of this ridge portion 314. An n-type AlInP current light confining layer 310, an n-type GaAs current confining layer 311 and a p-type GaAs flattening layer 312 are laminated on this spacer layer 309. A p-type GaAs contact layer 313 is formed on the protective layer 308, the end surfaces of the spacer layer 309, the current light confining layer 310 and the current confining layer 311 and on the flattening layer 312. A p-type electrode 315 is arranged on the p-type contact layer 313, and an n-type electrode 316 is arranged on the lower surface of the n-type GaAs substrate 301.

The n-type GaAs substrate 301 is doped with a dopant of Si and has a carrier density of 2×10$^{18}$ cm$^{-3}$. The n-type GaAs buffer layer 302 has a layer thickness of 0.5 μm, a dopant of Si and a carrier density of 1×10$^{18}$ cm$^{-3}$. The n-type (Al$_{0.7}$Ga$_{0.3}$)InP first clad layer 303 has a layer thickness of 1.5 μm, a dopant of Si and a carrier density of 5×10$^{17}$ cm$^{-3}$. The MQW active layer 304 is formed by interposing a non-doped multiple quantum well structure, in which a barrier layer of one layer and well layers of two layers are alternately laminated, between light guide layers. The well layer is made of GaInP and has a layer thickness of 0.005 μm. The barrier layer is made of (Al$_{0.5}$Ga$_{0.5}$)InP and has a layer thickness of 0.005 μm. The light guide layer is made of (Al$_{0.5}$Ga$_{0.5}$)InP and has a layer thickness of 0.05 μm. The p-type (Al$_{0.7}$Ga$_{0.3}$)InP second clad layer 305 has a total layer thickness of 0.2 μm and a dopant of Be. A portion of the second clad layer 305, which is put in contact with the active layer 304 and has a layer thickness of 0.1 μm, has a carrier density of 1×10$^{18}$ cm$^{-3}$. A portion of the second clad layer 305, which is put in contact with the spacer layer 309 and has a layer thickness of 0.1 μm, has a carrier density of 2×10$^{17}$ cm$^{-3}$. The p-type GaInP etching stop layer 306 has a layer thickness of 0.008 μm, a dopant of Be and a carrier density of 1×10$^{18}$ cm$^{-3}$. The p-type (Al$_{0.7}$Ga$_{0.3}$)InP third clad layer 307 has a layer thickness of 1.3 μm, a dopant of Be and a carrier density of 2×10$^{18}$ cm$^{-3}$. The p-type GaAs protective layer 308 has a layer thickness of 0.7 μm, a dopant of Be and a carrier density of 3×10$^{18}$ cm$^{-3}$. The p-type AlInP spacer layer 309 has a layer thickness of 0.2 μm, a dopant of Be and a carrier density of 2×10$^{17}$ cm$^{-3}$. The n-type AlInP current light confining layer 310 has a dopant of Si, and a portion thereof extended in the transverse direction in FIG. 6 has a layer thickness of 1.05 μm. In this current light confining layer 310, its interfacial portion, which is a portion located between an interface put in contact with the spacer layer 309 and a surface located apart by 0.2 μm from this interface, is formed to have a carrier density of 2×10$^{17}$ cm$^{-3}$. A portion, which belongs to this current light confining layer 310, has a thickness of 0.85 μm and is other than the above-mentioned interfacial portion, is formed to have a carrier density of 7×10$^{17}$ cm$^{-3}$. The n-type GaAs current confining layer 311 has a dopant of Si, a layer thickness of 0.35 μm and a carrier density of 2×10$^{18}$ cm$^{-3}$. The p-type GaAs flattening layer 312 is formed to have a dopant of Zn, a layer thickness of 0.5 μm and a carrier density of 2×10$^{18}$ cm$^{-3}$. The p-type GaAs contact layer 313 has a dopant of Zn, a layer thickness of 5 μm and a carrier density of 5×10$^{18}$ cm$^{-3}$.

Figure 7A:
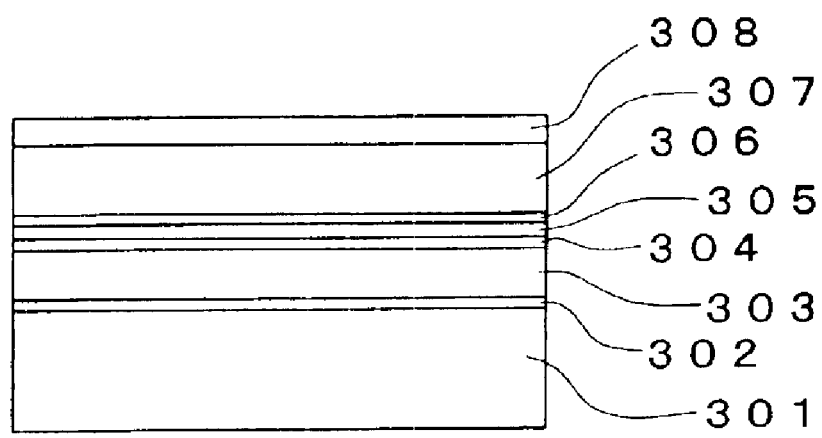
FIGS. 7A, 7B, 7C, and 7D are views sequentially showing the processes of fabricating the semiconductor laser element of the third embodiment.

The above-mentioned semiconductor laser element is fabricated as follows. That is, as shown in FIG. 7A, a buffer layer 302, a first clad layer 303, an MQW active layer 304, a second clad layer 305, an etching stop layer 306, a third clad layer 307 and a protective layer 308 are successively epitaxially grown on a substrate 301 by the first-time molecular-beam epitaxy growth method (hereinafter referred to as an MBE method).

Figure 7B:
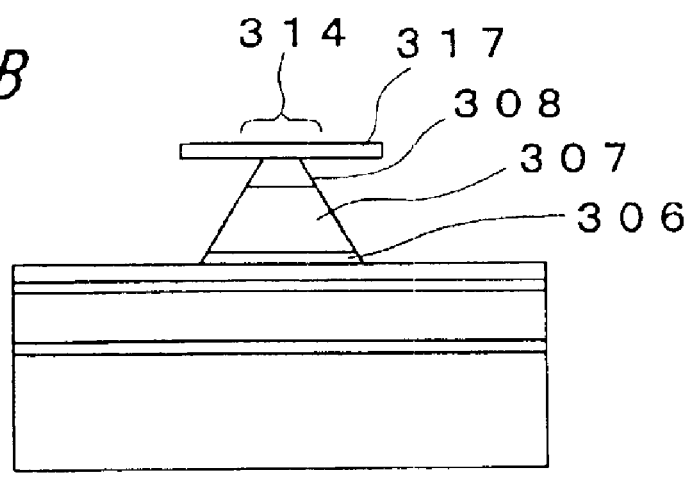

Next, a mask 317, which is extended in the [011] direction and constructed of a dielectric substance with a stripe-shape, for example, Al$_2$O$_3$, is formed on the protective layer 308. The protective layer 308 and the third clad layer 307 are etched to the etching stop layer 306, so that both sides in the widthwise direction of this etching stop layer 306 are exposed. In this stage, a portion, which belongs to the protective layer 308 and is located below both sides in the widthwise direction of the mask 317, is side-etched, as a consequence of which the portions on both sides in the widthwise direction of the mask 317 come to have an eaves-like shape. Thereafter, the exposed etching stop layer 306 is selectively removed, so that both sides in the widthwise direction of the second clad layer 305 are exposed. Thus, a stripe-shaped ridge portion 314 that has a width of 2.5 μm and extends in the [011] direction is formed (FIG. 7B).

Figure 7C:
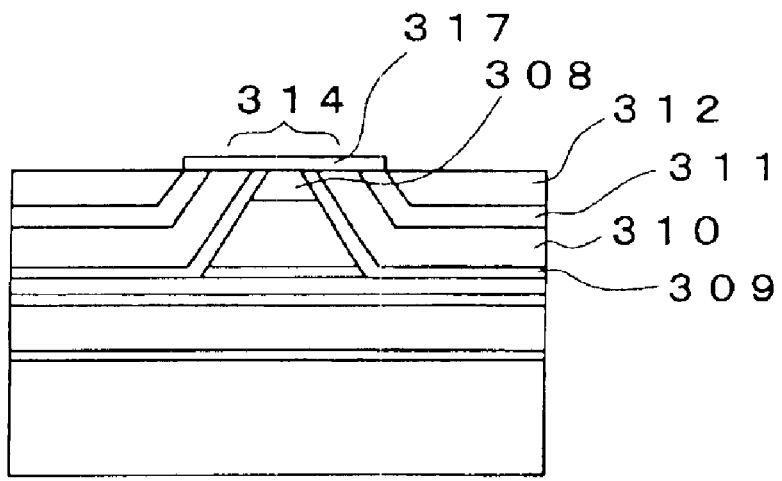

Subsequently, by the second-time MBE method, the spacer layer 309, the current light confining layer 310, the current confining layer 311 and the flattening layer 312 are grown on the second clad layer 305 and the ridge portion 114. In this stage, the end portions of the spacer layer 309, the current light confining layer 310 and the current confining layer 311 fill up the lower side of the eaves portion of the mask 317 (FIG. 7C).

The mask 317 on the protective layer 308 is removed. By the third-time MBE method, a contact layer 313 is formed on the protective layer 308, the end surface of the spacer layer 309, the end surface of current light confining layer 310, the end surface of the current confining layer 311 and on the flattening layer 312 (FIG. 7D).

Thereafter, a p-electrode 315 is formed on the contact layer 313, and an n-electrode 316 is formed on the lower surface of the semiconductor substrate 301, completing a laminate (FIG. 6).

Figure 7D:
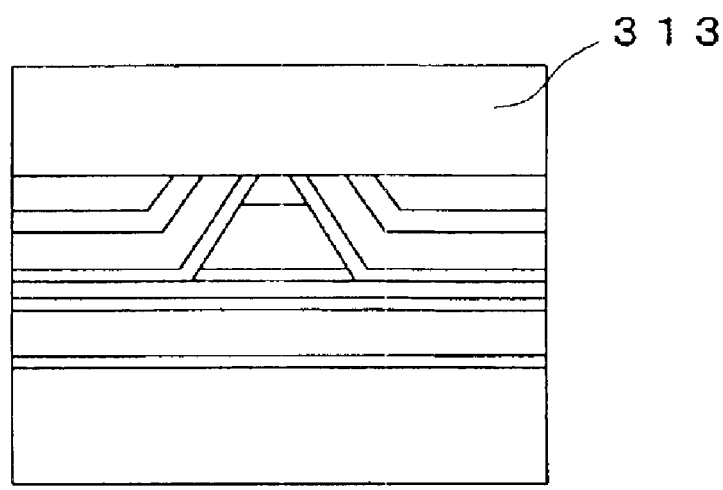

This laminate is cleaved to the resonator length of 800 μm with the resonator direction directed perpendicular to the plane of the sheet of FIG. 7D. Thereafter, one of the cleaved end surfaces is coated with an $Al_2O_3$ film by the electron-beam deposition method, making this cleaved end surface have a reflectance of about 7%. The other cleaved end surface is coated with a multilayer film, in which an $Al_2O_3$ film and an amorphous Si film are alternately laminated, making this cleaved end surface have a reflectance of about 95%. Thus, the semiconductor laser element of the end emission type is completed.

In the semiconductor laser element fabricated as described above, had an oscillation starting current of 40 mA and an I-L slope efficiency of 1.2 W/A and a driving temperature of 70° C. and stably effected laser oscillation by 80-mW pulse drive.

In the semiconductor laser element of the present embodiment, the etching stop layer 306 is arranged only just below the ridge portion 314, and therefore, only both side end portions in the widthwise direction of the etching stop layer 306 are put in contact with the spacer layer 309. Therefore, a depletion layer can be generated in the spacer layer 309 with scarcely receiving the influence of the carriers accumulated in the etching stop layer 306 when the bias voltage is applied. As a result, the capacitance of the semiconductor laser element can effectively be reduced, and the response speed during the laser oscillation can effectively be increased.

Moreover, the carrier density of the portion of the second clad layer 305 put in contact with the active layer 304 can be increased, and this allows the semiconductor laser element of high reliability to be provided by preventing the carrier leak from the active layer 304 at high temperature.

In the present embodiment, the semiconductor laser element is formed by using the AlGaInP-based compound semiconductor. However, it is acceptable to use an AlGaAs-based compound semiconductor or an InGaAsP-based compound semiconductor besides it.

(Fourth Embodiment)

Figure 8:
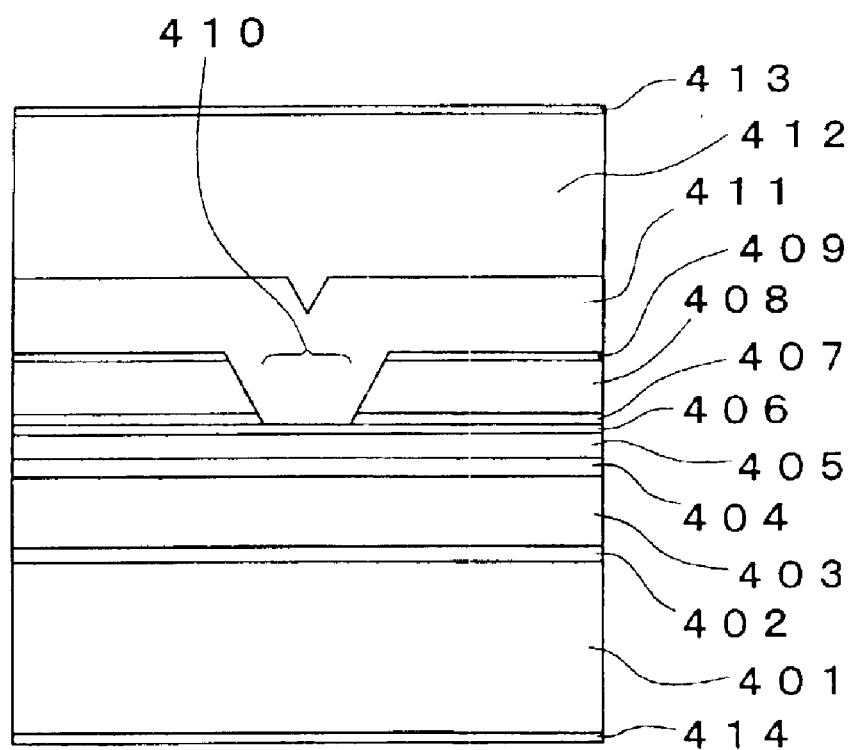
FIG. 8 is a view showing a semiconductor laser element according to a fourth embodiment of the present invention.

FIG. 8 is a view showing the semiconductor laser element of the fourth embodiment of the present invention. In this semiconductor laser element, an n-type GaAs buffer layer 402, an n-type $Al_{0.5}Ga_{0.05}As$ first clad layer 403, an MQW active layer 404, a p-type $Al_{0.5}Ga_{0.5}As$ second clad layer 405 and a p-type GaInP etching stop layer 406 are successively laminated on an n-type GaAs substrate 401. A non-doped $Al_{0.7}Ga_{0.3}As$ spacer layer 407, an n-type $Al_{0.7}Ga_{0.3}As$ current light confining layer 408 and an n-type GaAs protective layer 409 are arranged on both sides in the widthwise direction on this etching stop layer 406. A p-type $Al_{0.5}Ga_{0.5}As$ third clad layer 411 is formed between the spacer layer 407, current light confining layer 408 and protective layer 409, which are arranged on both sides in this widthwise direction, and on the etching stop layer 406 and on the protective layer 409. A p-type GaAs contact layer 412 is laminated on this third clad layer 411. A p-type electrode 413 is arranged on the p-type contact layer 412, and an n-type electrode 414 is arranged on the lower surface of the n-type GaAs substrate 401.

The n-type GaAs substrate 401 is doped with a dopant of Si and has a carrier density of $2\times10^{18}$ cm$^{-3}$. The n-type GaAs buffer layer 402 has a layer thickness of 0.5 μm, a dopant of Si and a carrier density of $1\times10^{18}$ cm$^{-3}$. The n-type $Al_{0.5}Ga_{0.5}As$ first clad layer 403 has a layer thickness of 2 μm, a dopant of Si and a carrier density of $5\times10^{17}$ cm$^{-3}$. The MQW active layer 404 is formed by interposing a non-doped multiple quantum well structure, in which a barrier layer of one layer and well layers of two layers are alternately laminated, between light guide layers. The well layer is constructed of $Al_{0.1}Ga_{0.9}As$ and has a layer thickness of 0.008 μm. The barrier layer is constructed of $Al_{0.3}Ga_{0.7}As$ and has a layer thickness of 0.005 μm. The light guide layer is constructed of $Al_{0.3}Ga_{0.7}As$ and has a layer thickness of 0.03 μm. The p-type $Al_{0.5}Ga_{0.5}As$ second clad layer 405 has a layer thickness of 0.2 μm, a dopant of Zn and a carrier density of $0.5\times10^{18}$ cm$^{-3}$. The p-type GaInP etching stop layer 406 has a layer thickness of 0.01 μm, a dopant of Zn and a carrier density of $5\times10^{17}$ cm$^{-3}$. The non-doped $Al_{0.7}Ga_{0.3}As$ spacer layer 407 has a layer thickness of 0.4 μm. The n-type $Al_{0.7}Ga_{0.3}As$ current light confining layer 408 has a layer thickness of 0.3 μm, a dopant of Si and a carrier density of $1\times10^{18}$ cm$^{-3}$. The n-type GaAs protective layer 409 has a dopant of Si, a layer thickness of 0.1 μm and a carrier density of $2\times10^{18}$ cm$^{-3}$. The p-type $Al_{0.5}Ga_{0.5}As$ third clad layer 411 has a dopant of Zn, a layer thickness of 2.5 μm and a carrier density of $2\times10^{18}$ cm$^{-3}$. The p-type GaAs contact layer 412 has a dopant of Zn, a layer thickness of 3 μm and a carrier density of $3\times10^{18}$ cm$^{-3}$.

Figure 9A:
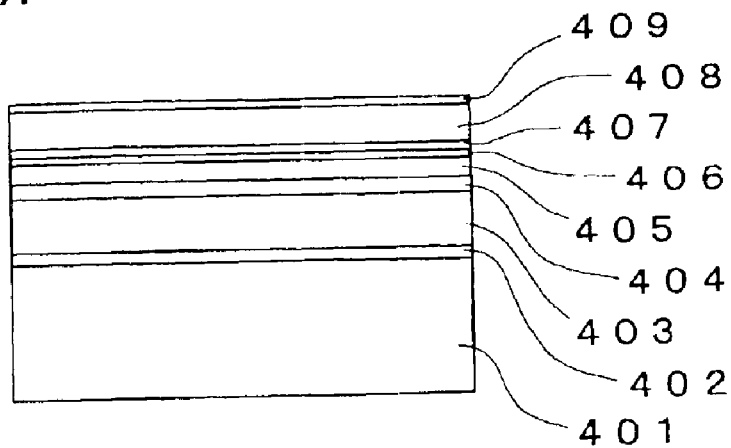
FIGS. 9A, 9B and 9C are views sequentially showing the processes of fabricating the semiconductor laser element of the fourth embodiment.

The above-mentioned semiconductor laser element is fabricated as follows. That is, as shown in FIG. 9A, the buffer layer 402, the first clad layer 403, the MQW active layer 404, the second clad layer 405, the etching stop layer 406, the spacer layer 407, the current light confining layer 408 and the protective layer 409 are successively epitaxially grown on the GaAs substrate 401 by the first-time MOCVD method.

Figure 9B:
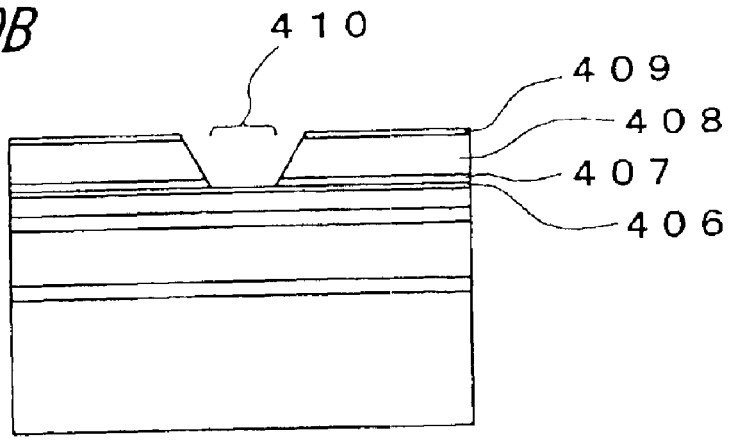

Next, a resist mask, which has a stripe-shaped window extended in the [011] direction, is formed on the protective layer 409. The protective layer 409, the current light confining layer 408 and the spacer layer 407, which correspond to the window portion, are etched to the etching stop layer 406, forming a stripe-shaped groove 410 (FIG. 9B).

Figure 9C:
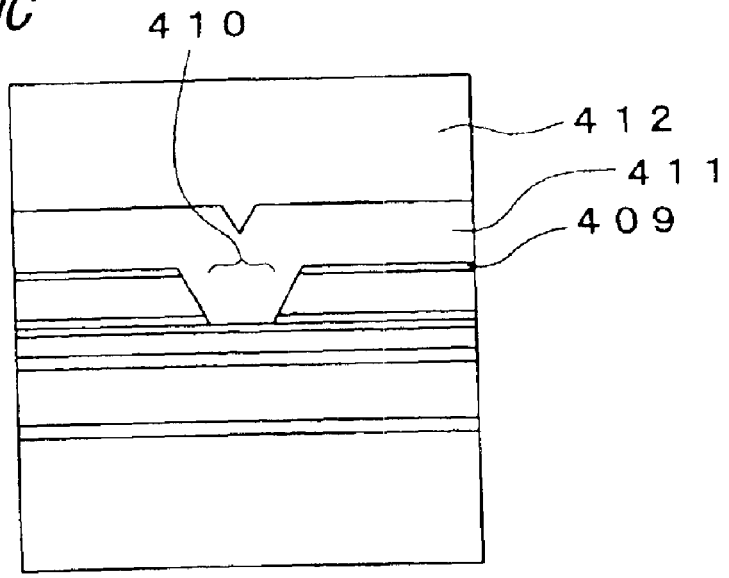

Subsequently, the third clad layer 411 is laminated in the groove 410 and on the protective layer 409 by the second-time MOCVD method. Subsequently, the contact layer 412 is laminated. (FIG. 9C).

Thereafter, a p-electrode 413 is formed on the upper surface of the contact layer 412, and an n-electrode 414 is formed on the lower surface of the semiconductor substrate 401, completing a laminate.

This laminate is cleaved to a resonator length of 600 μm with the direction perpendicular to the plane of the sheet of FIG. 8 as the resonator direction. Thereafter, one of the cleaved end surfaces is coated with an $Al_2O_3$ film by the electron-beam deposition method, setting the reflectance of this cleaved end surface to about 12%. The other cleaved end surface is coated with a multilayer, in which an $Al_2O_3$ film and an amorphous Si film are alternately laminated, setting the reflectance of this cleaved end surface to about 95%. Thus, the semiconductor laser element of the end emission type is completed.

The semiconductor laser element fabricated as described above had an oscillation starting current of 27 mA, an I-L slope efficiency of 1.1 W/A and stably effected laser oscillation by 150-mW pulse drive at a temperature of 70° C. When this semiconductor laser element was driven by a pulse current that had a pulse width of 100 ns, a duty ratio of 50%, a top current of 180 mA and a bottom current of 33 mA, the light output pulse had a rise time of 1.8 ns and a fall time of 1.9 ns. In short, a pulse waveform of a satisfactory shape, of which the rise time and the fall time of the output pulse were short, was obtained.

Moreover, in the semiconductor laser element of the present embodiment, the second clad layer 405, the etching stop layer 406, the spacer layer 407, the current light confining layer 408 and the protective layer 409 are continuously formed by the first-time MOCVD method. Accordingly, there occurs almost no crystal defects in the p-n junction interface and no change in the level due to the diffusion of the impurity. Therefore, trapping of an electron in the crystal defect, a reduction in the electron mobility due to the change in level and so on scarcely occur when the bias voltage is applied, and this enables the provision of the semiconductor laser element of which the response speed is fast.

Moreover, in the semiconductor laser element of the present embodiment, the spacer layer 407 is non-doped and has a high resistance. This enables the current confining to be effectively performed in the portion corresponding to the groove portion 410 of the third clad layer 411.

In the present embodiment, the semiconductor laser element is formed by using the AlGaAs-based compound semiconductor. However, it is acceptable to use an AlGaInP-based compound semiconductor or an InGaAsP-based compound semiconductor besides it.

The semiconductor laser elements of the first, second and fourth embodiments are fabricated by the MOCVD method. The semiconductor laser element of the third embodiment is fabricated by the MBE method. However, the semiconductor laser element of the first through fourth embodiments may be fabricated by another method of, for example, the ALE (Atomic Layer Epitaxy) method or the LPE (Liquid Phase Epitaxy) method.

Moreover, in the semiconductor laser elements of the first through fourth embodiments, the AlGaAs-based compound semiconductor and the InGaAlP-based compound semiconductor are laminated on the GaAs substrate. However, an InAlGaAsPN-based compound semiconductor or an InAlGaN-based compound semiconductor may be laminated on an InP substrate, a sapphire substrate or an SiC substrate besides the GaAs substrate.

Moreover, in the aforementioned embodiments, the first conductive type is the p-type, and the second conductive type is the n-type. However, it is acceptable that the first conductive type is the n-type and the second conductive type is the p-type.

As is apparent from the above description, according to the semiconductor laser element of the present invention, in which at least the first conductive type first clad layer, the active layer, the second conductive type second clad layer, the second conductive type etching stop layer that has an energy bandgap smaller than that of the second clad layer, the ridge-shaped second conductive type third clad layer and the first conductive type current light confining layer that is arranged on both sides in the widthwise direction of the third clad layer and has a refractive index smaller than the refractive index of the second clad layer are provided on the semiconductor substrate, the second conductive type or intrinsic spacer layer is arranged in contact with the etching stop layer between the etching stop layer and the current light confining layer. With this arrangement, when the bias voltage is applied to this semiconductor laser element, the depletion layer generated in the interface between the spacer layer and the current light confining layer can be spread to the spacer layer. Therefore, the response speed during the pulse oscillation of this semiconductor laser element can be increased with a reduction in the capacitance between the spacer layer and the current light confining layer. As a result, the semiconductor laser element, which has a satisfactory pulse waveform and is appropriate for the light source of the optical disk device of which the writing speed is fast, can be provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser element, comprising:
   a first conductive type first clad layer,
   an active layer,
   a second conductive type second clad layer,
   a second conductive type etching stop layer that has an energy bandgap smaller than that of the second clad layer,
   a ridge-shaped second conductive type third clad layer,
   a first conductive type current light confirming layer that is arranged on both sides in a widthwise direction of the third clad layer and has a reflective index smaller then a refractive index of the second clad layer; and
   a second conductive type or intrinsic spacer layer arranged in contact with the etching stop layer between the etching stop layer and the current light confining layer.

2. A semiconductor laser element as claimed in claim 1, wherein
   the spacer layer has a refractive index equal to or smaller than the reflective index of the second clad layer.

3. A semiconductor laser element as claimed in claim 1, wherein
   the spacer layer has a carrier density lower than a carrier density of the second clad layer.

4. A semiconductor laser element as claimed in claim 3, wherein
   the carrier density of the spacer layer is not higher than $1 \times 10^{18}$ $cm^{-3}$.

5. A semiconductor laser element as claimed in claim 1, wherein an interfacial portion of the current light confining layer, which is in contact with the spacer layer, has a carrier density lower than the remainder of the current light confining layer.

6. A semiconductor laser element as claimed in claim 5, wherein the carrier density of the interfacial portion of the current light confining layer in contact with the spacer layer is not higher than $1 \times 10^{18}$ cm$^{-3}$.

7. A semiconductor laser element as claimed in claim 1, wherein
the spacer layer has a thickness of not smaller than 0.05 μm and not greater than 0.5 μm.

8. A semiconductor laser element as claimed in claim 7, wherein
the spacer layer has a thickness of not smaller than 0.1 μm and not greater than 0.3 μm.

9. A semiconductor laser element as claimed in claim 5, wherein the interfacial portion of the current light confining layer in contact with the spacer layer has a thickness of not smaller than 0.5 μm and not greater than 0.5 μm.

10. A semiconductor laser element as claimed in claim 1, wherein the spacer layer is doped with an impurity than contains carbon.

11. A semiconductor laser element as claimed in claim 1, wherein the etching stop layer in contact with the spacer layer is doped with an impurity that contains carbon.

12. A semiconductor laser element as claimed in claim 1, wherein the second clad layer is doped with an impurity that contains carbon at least on the spacer layer side.

13. A semiconductor laser element as claimed in claim 12, wherein the second clad layer is doped with an impurity other than carbon in its portion that is in contact with the active layer.

14. A semiconductor laser element as claimed in claim 1, wherein the second clad layer has a portion in contact with the active layer that has a carrier density higher than a carrier density of its portion in contact with the spacer layer.

15. A semiconductor laser element as claimed in claim 1, wherein the current light confining layer is doped with an impurity that contains silicon.

* * * * *